United States Patent
Anwar

(10) Patent No.: US 11,984,892 B2
(45) Date of Patent: May 14, 2024

(54) COMPARATOR CIRCUIT AND DRIVER

(71) Applicant: JVCKENWOOD Corporation, Yokohama (JP)

(72) Inventor: Marta Dinata Anwar, Yokohama (JP)

(73) Assignee: JVCKENWOOD CORPORATION, Yokohama (JP)

( * ) Notice: Subject to any disclaimer, the term of this patent is extended or adjusted under 35 U.S.C. 154(b) by 51 days.

(21) Appl. No.: 17/955,176

(22) Filed: Sep. 28, 2022

(65) Prior Publication Data
US 2023/0020460 A1 Jan. 19, 2023

Related U.S. Application Data

(63) Continuation of application No. PCT/JP2022/006207, filed on Feb. 16, 2022.

(30) Foreign Application Priority Data

May 25, 2021 (JP) ................. 2021-087341

(51) Int. Cl.
*H03K 3/012* (2006.01)
*H03K 5/24* (2006.01)
*H03K 17/687* (2006.01)
*H03K 19/00* (2006.01)

(52) U.S. Cl.
CPC ............. *H03K 3/012* (2013.01); *H03K 5/249* (2013.01); *H03K 17/687* (2013.01); *H03K 19/0013* (2013.01)

(58) Field of Classification Search
CPC .......... H03K 3/012; H03K 5/24; H03K 5/249; H03K 17/687; H03K 19/0013
USPC ........................ 327/50, 63, 64, 97, 108, 109
See application file for complete search history.

(56) References Cited

U.S. PATENT DOCUMENTS

2010/0328295 A1\* 12/2010 Piasecki ................... G09G 3/04
345/212

FOREIGN PATENT DOCUMENTS

JP 2013105166 A 5/2013

\* cited by examiner

*Primary Examiner* — William Hernandez
(74) *Attorney, Agent, or Firm* — Procopio, Cory, Hargreaves & Savitch LLP

(57) ABSTRACT

A comparator circuit according to the present embodiment: including a comparator element configured to output a matching signal indicating whether or not a value of a first input signal matches a value of a second input signal; a flip-flop circuit including a data input terminal to which a constant potential is supplied and a clock input terminal and configured to hold a value of the data input terminal based on a self-clock signal input to the clock input terminal; and a clock generation circuit configured to generate the self-clock signal based on the matching signal.

5 Claims, 4 Drawing Sheets

COMPARATOR CIRCUIT AND DRIVER

CROSS REFERENCE TO RELATED APPLICATION

This application is based upon and claims the benefit of priority from Japanese patent application No. 2021-087341, filed on May 25, 2021, the disclosure of which is incorporated herein in its entirety by reference.

BACKGROUND

This disclosure relates to a comparator circuit and a driver.

Patent Literature 1 (Japanese Unexamined Patent Application Publication No. 2013-105166) discloses the horizontal driver of a liquid crystal display device. In FIG. 2 of Patent Literature 1, a comparator compares the counter output with pixel value of the digital image data. The comparator outputs a matching pulse indicating the both data are matched to the D-type flip-flop circuit. Then, the positive and negative polarity switches are switched in conjunction with the output of the D-type flip-flop.

Furthermore, the horizontal driver of Patent Literature 1 includes a comparator clock and counter clock generation circuit part. A comparator clock and counter clock generation circuit unit generates a comparator clock and a counter clock based on an external clock.

SUMMARY

In Patent Literature 1, the comparator clock is generated based on the external clock signal. Therefore, many large buffers are required for a transmission of the clock signal from the external. This makes it difficult to reduce power consumption.

The comparator circuit according to the present embodiment is equipped with a flip-flop circuit that is equipped with a comparator element that outputs a the matching signal indicating whether or not the value of the first input signal matches the value of the second input signal, a data input terminal and a clock input terminal to which a constant potential is supplied, and holds the value of the data input terminal according to the self clock signal to the clock input terminal, and a clock generation circuit that generates the self clock signal based on the output signal from the flip-flop circuit and the matching signal.

BRIEF DESCRIPTION OF THE DRAWINGS

The above and other aspects, advantages and features will be more apparent from the following description of certain embodiments taken in conjunction with the accompanying drawings, in which.

The above and other aspects, advantages and features will be more apparent from the following description of certain embodiments taken in conjunction with the accompanying drawings, in which.

DETAILED DESCRIPTION

Hereafter, a specific embodiment to which the present invention is applied will be described in detail with reference to the drawings. However, this disclosure is not limited to the following examples. In addition, the following descriptions and drawings have been simplified, as appropriate, for clarity.

Figure 1:
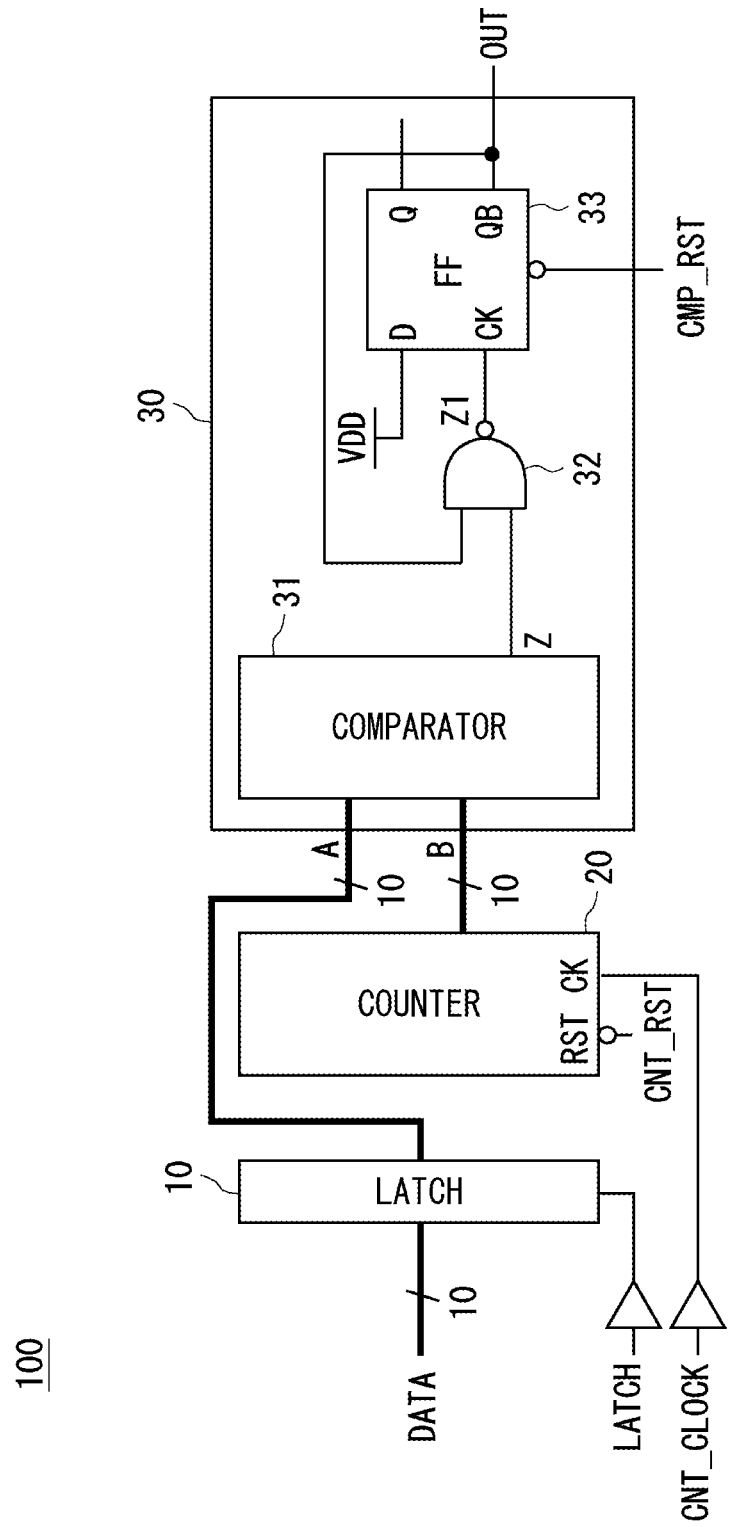
FIG. 1 is a circuit diagram showing a configuration of a driver using a comparator circuit.

The comparator circuit according to the present embodiment and the driver using it are described below. FIG. 1 is a circuit diagram showing a driver 100 with a comparator circuit 30. Specifically, the driver shown in FIG. 1 is a horizontal driver for driving one row of pixels in a liquid crystal display device.

Figure 2:
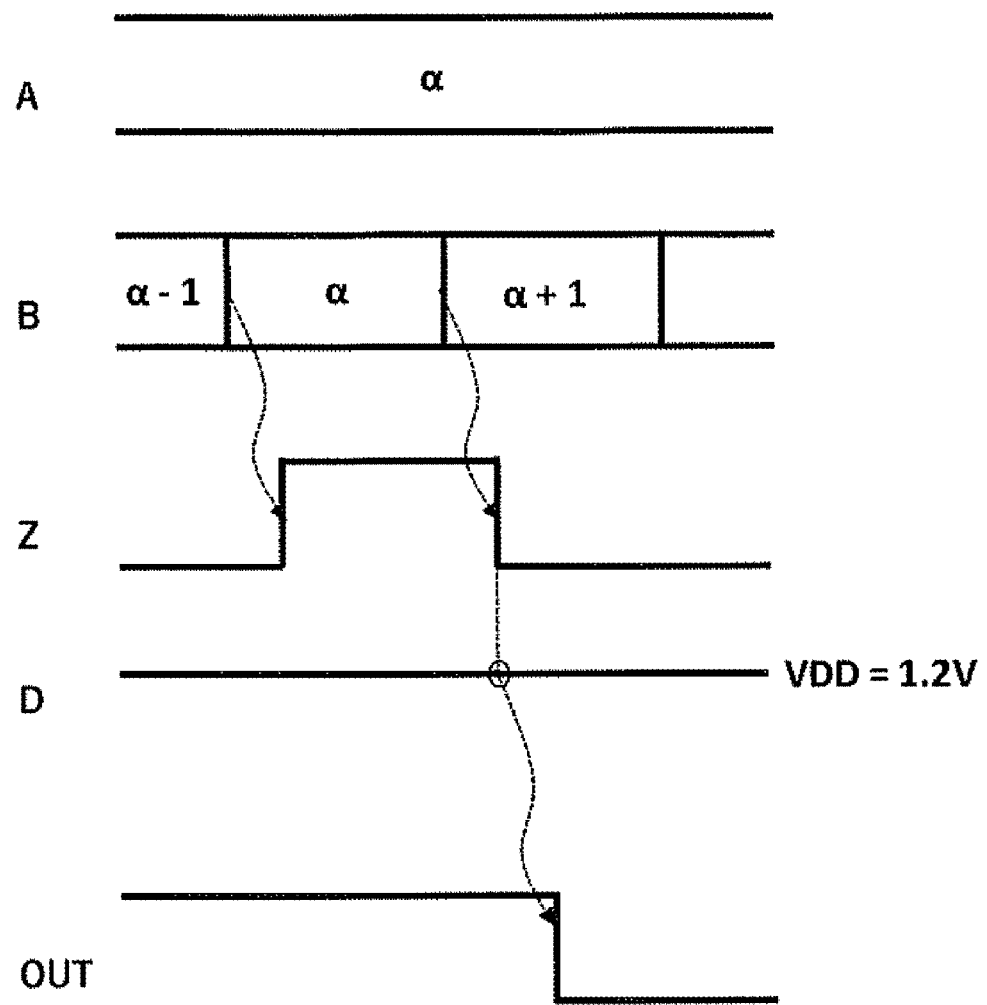
FIG. 2 is a timing chart showing an operation of the comparator circuit.

FIG. 2 is a timing chart showing an operation of the comparator circuit 30.

The driver 100 includes a latch circuit 10, a counter 20 and the comparator circuit 30. Here, 10-bit image data DATA are input to the driver 100. That is, one pixel is represented in 1,024 greyscales (=10 bits). Of course, the number of bits of image data is not limited to the above values.

A latch signal LATCH and the image data DATA are input to the latch circuit 10. The latch circuit 10 latches the 10-bit image data DATA in response to the latch signal LATCH. The latch circuit 10 outputs the latched image data DATA to the comparator circuit 30 in parallel. The image data DATA output from the latch circuit 10 is defined as the latch output A. The latch output A is 10-bit parallel data. In FIG. 2, the value of the latch output A is defined as $\alpha$.

A counter clock signal CNT_CLOCK and a counter reset signal CNT_RST are input to the counter 20. The counter 20 performs a counting operation in synchronization with the counter clock signal CNT_CLOCK. For example, the counter 20 counts up the count value at the clock frequency of the counter clock signal CNT_CLOCK. The counter 20 outputs the count value generated by the counting operation to the comparator circuit 30.

The counter 20 resets the count value to the initial value in response to the counter reset signal CNT_RST. The counter reset signal CNT_RST corresponds to the horizontal scanning frequency. The output of the counter 20 is 10 bits. Thus, the counter 20 increments the count value by one from 0 to 1023. The counter 20 outputs a 10-bit count value to the comparator circuit 30. The count value output from the counter 20 is defined as the counter output B. The counter output B is 10-bit parallel data. As shown in FIG. 2, the counter output B counts up a count value as $\alpha-1$, $\alpha$, and $\alpha+1$ in this order.

The comparator circuit 30 includes a comparator element 31, a clock generation circuit 32, and a FF (flip-flop) circuit 33. The comparator circuit 30 is a self-clocked comparator circuit that generates a self clock signal based on its own output. Therefore, no external clock signal is input to the comparator circuit 30.

The comparator element 31 compares the latch output A with the counter output B. The comparator element 31 generates a matching signal Z indicating that the latch output A matches the counter output B. The comparator element 31 outputs the matching signal Z to the clock generation circuit 32. The latch output A and the counter output B are each 10-bits of parallel data, respectively. The comparator element 31 compares each bit of the latch output A with each corresponding bit of the counter output B. The comparator element 31 determines that the latch output A matches the counter output B when all the bits of the latch output A respectively coincide with those of the counter output B.

When the latch output A matches the counter output B, the comparator element 31 asserts the matching signal Z. When the latch output A does not match the counter output B, the comparator element 31 deasserts the matching signal Z, and therefore the matching signal Z becomes a positive pulse signal as shown in FIG. 2. When the value of the counter output B is a, a level of the matching signal Z becomes high When the value of the counter output B is not α, a level of the matching signal Z becomes low.

The clock generation circuit 32 generates the self clock signal based on the matching signal Z output from the comparator circuit 30 and the output signal of the clock generation circuit 32. The clock generation circuit 32 outputs the self clock signal to the FF circuit 33.

For example, the clock generation circuit 32 includes a NAND circuit. Specifically, the output terminal of the comparator element 31 and the inverted output terminal QB of the FF circuit 33 are connected to the clock generation circuit 32. Therefore, the matching signal Z from the comparator element 31 and the inverted output signal of the FF circuit 33 are input to the clock generation circuit 32. The clock generation circuit 32 outputs NAND (non-conjunction) of the matching signal Z and the inverted output signal. The output signal from the clock generation circuit 32 is defined as being the internal signal Z1. The clock generation circuit 32 outputs the internal signal Z1 to the FF circuit 33.

The FF circuit 33 is a D-type flip-flop circuit. The FF circuit 33 has a data input terminal D, a clock input terminal CK, a non-inverting output terminal Q, and an inverting output terminal QB. The output of the clock generation circuit 32 is connected to the clock input terminal CK. The internal signal Z1 is input to the clock input terminal CK. The FF circuit 33 samples and holds the data value of the data input terminal D in response to the internal signal Z1. The FF circuit 33 holds a value of 1-bit.

The FF circuit 33 outputs a non-inverted output signal corresponding to the held value from the non-inverted output terminal Q. The FF circuit 33 outputs the inverted output signal obtained by inverting the non-inverted output signal from the inverted output terminal QB. The inverted output signal becomes the output signal OUT from the comparator circuit 30. When the value of the input data held by the FF circuit 33 is 1, the non-inverted output signal becomes the high level and the inverted output signal becomes the low level. When the value of the input data held by the FF circuit 33 is 0, the non-inverted output signal becomes the low-level signal and the inverted output signal becomes the high-level signal.

A comparator reset signal CMP_RST is input to the FF circuit 33. The FF circuit 33 resets the holding data in response to the comparator reset signal CMP_RST. As a result, the data value held in the FF circuit 33 becomes 0. When the FF circuit 33 is reset by the comparator reset signal CMP_RST, the inverted output signal becomes the high-level signal and the non-inverted output signal becomes the low-level signal.

A constant power supply voltage VDD is input to the data input terminal D as input data. Therefore, a constant potential is always supplied to the data input terminal D. The clock input terminal CK is connected to the output of the clock generation circuit 32. Therefore, the internal signal Z1 from the clock generation circuit 32 is input to the clock input terminal CK of the FF circuit 33.

After the FF circuit 33 is reset by the comparator reset signal CMP_RST, the FF circuit 33 samples a constant power supply voltage VDD in response to the internal signal Z1. The FF circuit 33 detects the edge of the internal signal Z1 and holds the input data in the data input terminal D. Thus, at the edge of the internal signal Z1, the non-inverted output signal becomes the high-level signal and the inverted output signal becomes the low-level signal.

Therefore, as shown in FIG. 2, the inverted output signal becomes a negative step signal. The output signal OUT of the comparator circuit 30 is the high-level signal before the falling edge of the matching signal Z and changes to the low-level signal at the falling edge of the matching signal Z. Thus, the negative step signal is output from the inverted output terminal QB of the FF circuit 33. The level of the output signal OUT varies according to the falling edge of the matching signal Z.

The comparator circuit 30 has a clock generation circuit 32 that generates the self clock signal. A clock generation circuit 32 generates an internal signal Z1, which becomes the self clock signal, based on the matching signal Z and the output signal OUT. That is, the comparator circuit 30 becomes a self-clocking comparator that operates on the self clock signal generated by the comparator circuit 30 itself. The FF circuit 33 holds the data in response to the internal signal Z1, which is the self clock signal. Therefore, a power consumption can be reduced because no buffer is required for the external clock.

Figure 3:
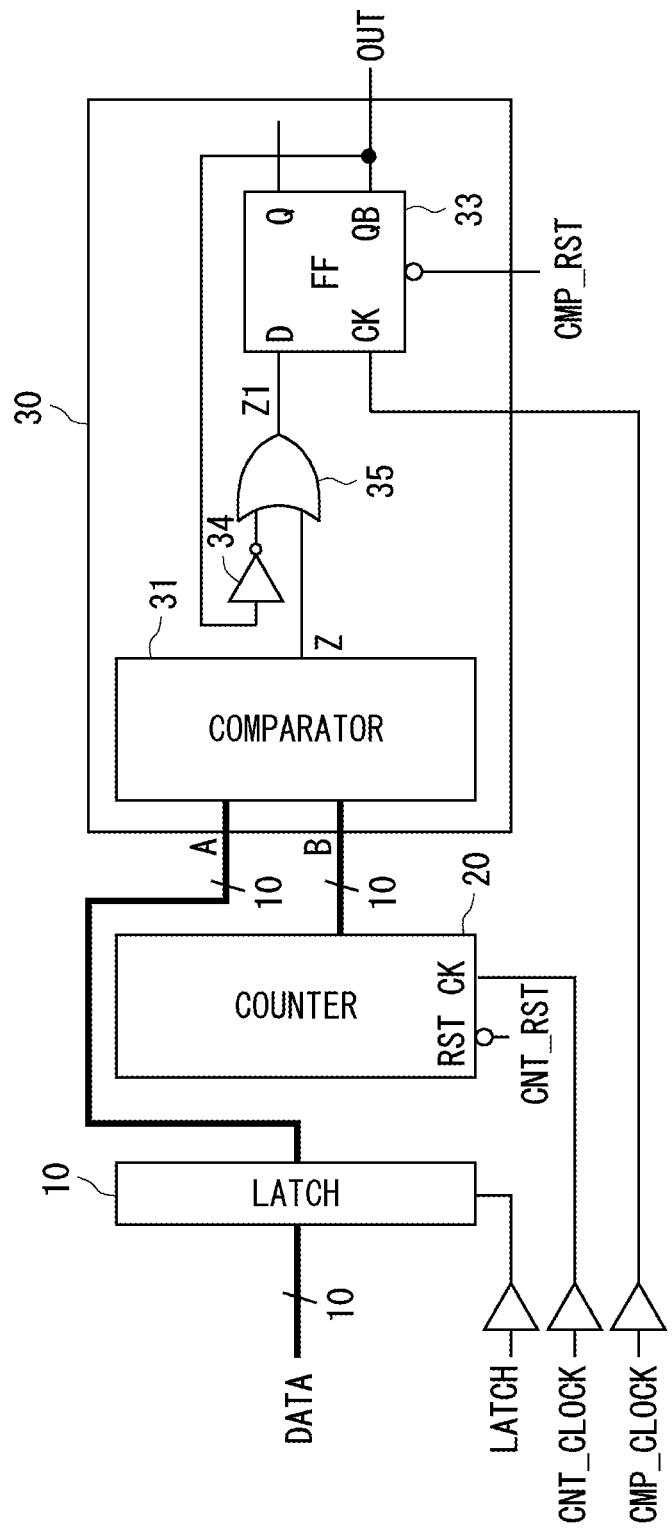
FIG. 3 is a circuit diagram showing the driver with the comparator circuit according to a comparative example.

FIG. 3 shows the driver including the comparator circuit 30 which is the comparative example. The basic operation of the latch circuit 10, the counter 20 and the comparator element 31 is the same as that in FIG. 1, so a detailed explanation is omitted. For example, the comparator element 31 outputs the matching signal Z indicating that the latch output A matches the counter output B. The matching signal Z is a positive pulse.

In the comparator circuit 30 shown in FIG. 3, an external comparator clock signal CMP_CLOCK is input to the clock input terminal CK of the FF circuit 33. The comparator circuit 30 is a clock comparator that operates in response to the comparator clock signal CMP-CLOCK.

The inverted output signal of the FF circuit 33 is input to the OR circuit 35 via an inverter 34. The matching signal Z from the comparator element 31 is input to the OR circuit 35. The internal signal Z1 output from the OR circuit 35 is input to the data input terminal D of the FF circuit 33. That is, the internal signal Z1 becomes the input data to be input to the FF circuit 33. The FF circuit 33 is reset by the comparator reset signal CMP_RST. After the FF circuit 33 is reset, the FF circuit 33 holds the value of the input data in response to the comparator clock signal CMP_CLOCK.

Ideally, the FF circuit 33 samples the input data at a central point in time in response to the comparator clock signal CMP_CLOCK. For example, when the comparator clock signal CMP_CLOCK has jitter, a timing error may occur between the comparator clock signal CMP_CLOCK and the input data in the comparator circuit 30 shown in FIG. 3.

On the other hand, in the comparator circuit 30 according to this embodiment, a constant potential is always supplied to the data input terminal D. That is, the power supply voltage VDD is supplied to the data input terminal D. Therefore, the FF circuit 33 in FIG. 1 can prevent the occurrence of a timing error between the internal signal Z1, which is the self clock signal, and the input data. This can improve reliability.

Furthermore, since the driver includes two or more the comparator circuits 30 illustrated in FIG. 1, the driver can omit two or more buffers, thus reducing power consumption. For example, when the driver 100 is applied to a WUXGA Liquid Crystal On-Silicon (LCOS) device with a frame rate of 120 Hz, the power consumption of the device can be reduced from 1188 mW to 1087 mW. That means an 8.5% (=101 mW) reduction in power consumption.

Figure 4:
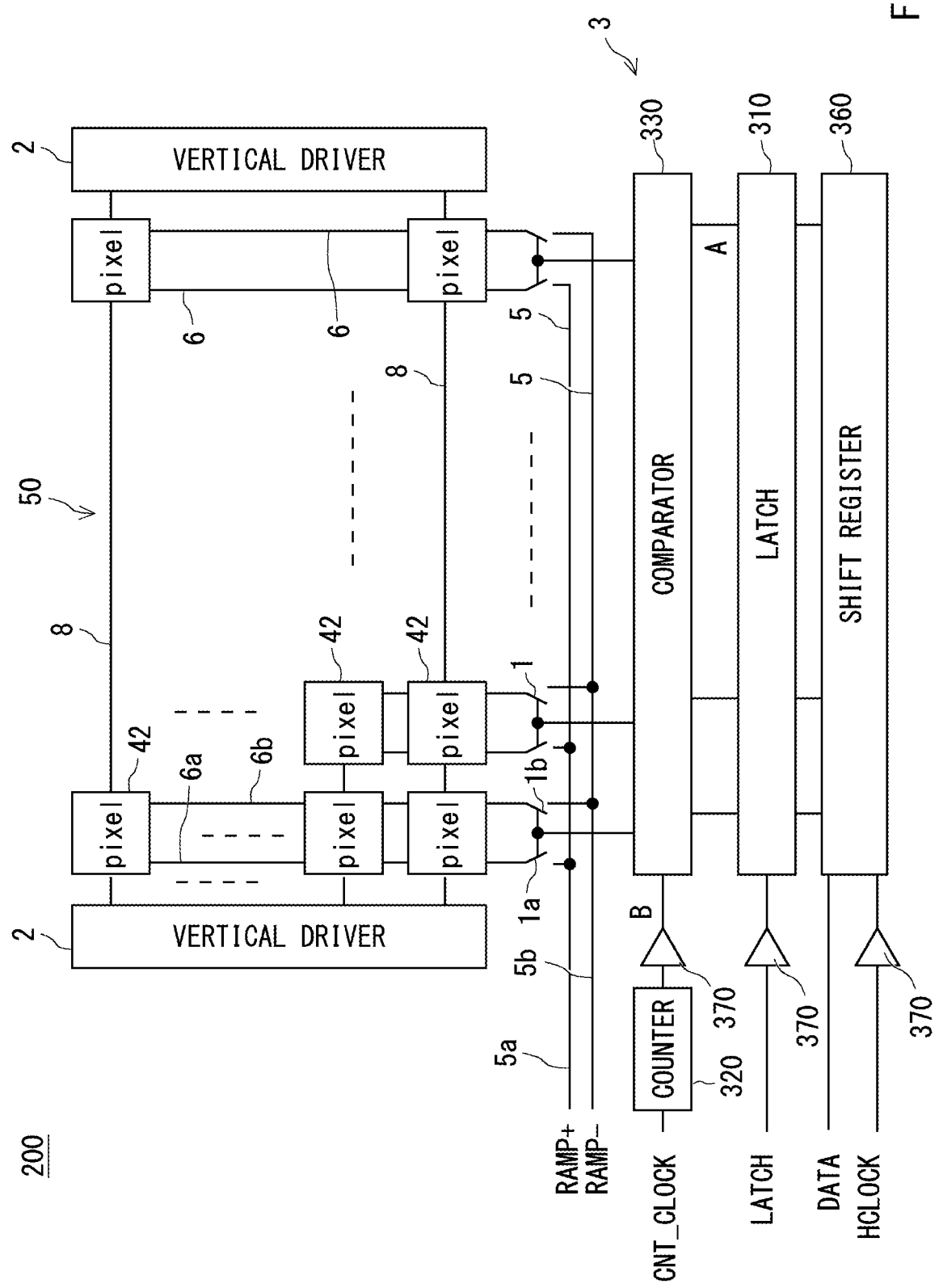
FIG. 4 shows the configuration of a liquid crystal display device using the driver.

The configuration of a liquid crystal display device 200 in which the comparator circuit 30 is applied to the driver will be described with reference to FIG. 4. The liquid crystal display device 200 is an LCOS display. FIG. 4 is a block diagram showing the backplane of the LCOS display.

The liquid crystal display device 200 includes a pixel display part 50, a vertical driver 2, and a horizontal driver 3. The horizontal driver 3 has the driver 100 shown in FIG. 1. Specifically, the horizontal driver 3 has m (m is an integer equal to or greater than 2) drivers 100 corresponding to the number of pixels for one line.

The pixel display part 50 has a plurality of data lines 6, a plurality of gate lines 8 and a plurality of pixels 42. The plurality of the data lines 6 are arranged parallel to each other. The plurality of the gate lines 8 are arranged parallel to each other. The plurality of the data lines 6 are arranged to intersect with the plurality of the gate lines 8. The gate lines 8 are row scan lines.

The liquid crystal display device 200 is includes two or more sets of the data lines 6 in a set of two data lines. The liquid crystal display device 200 inverts and drives the pixels 42 using one of the sets of the data lines 6. Hereafter, regarding the sets of the data lines 6, the data line 6 on the positive side is defined as a data line 6a, and the data line 6 on the negative side is defined as a data line 6b. For switches 1 and video signal lines 5, the polarity is similarly respectively identified by defining a switch 1a, a switch 1b, a video signal line 5a and a video signal line 5b. To reverse the polarity, two systems including the data lines 6, the switches 1 and the video signal lines 5 are provided.

The pixels 42 are located at the intersections of the data lines 6 and the gate lines 8. The pixels 42 are arranged in a matrix. Each pixel 42 is driven by one set of the two data lines 6 and one of the gate line 8. For example, when there are n gate lines 8 and 2 m data lines, the pixels 42 are arranged in a matrix of n rows by m columns. Each of m and n is an integer equal to or greater than 2. Each of the pixels 42 includes a pixel driver and a pixel electrode to drive liquid crystals.

The vertical driver 2 performs vertical drive to select the gate lines 8 for each horizontal scanning period. The vertical driver 2 supplies scanning signals to the gate lines 8. That is, the vertical driver 2 supplies the scanning signals so that the first row to n-th row of gate lines 8 are sequentially selected. This sequentially selects the pixels 42 for each row. All gate lines 8 are selected within one vertical scanning period. The pixels 42 in a selected row can be written by the video signal.

The horizontal driver 3 performs horizontal driving to drive the switches 1 within a horizontal scanning period. In this way, the video signals are supplied to the plurality of the data lines 6. As described above, each set of the two data lines 6a and 6b is connected to the pixels 42 as a pair. Thus, the two data lines 6 a and 6b are commonly connected to each of the pixels 42 in a row.

The data line 6a is connected to the video signal line 5a via the switch 1a. The data line 6b is connected to the video signal line 5b via the switch 1b. A video signal RAMP+ on the positive side is supplied to the video signal line 5a. A video signal RAMP− on the negative side is supplied to the video signal line 5b. The horizontal driver 3 controls the switches 1a and 1b.

Thus, one data line 6a of the set of the data line 6a and 6b is supplied with the video signal RAMP+ on the positive polarity, and the other data line 6b is supplied with the video signal RAMP− on the negative polarity. The video signal RAMP+ on the positive polarity becomes a positive voltage with respect to the common potential of the common electrode line, and the video signal RAMP− on the negative polarity becomes a negative voltage with respect to the common potential of the common electrode line. The horizontal driver 3 can supply the video signal RAMP+ on the positive polarity and the video signal RAMP− on the negative polarity to the pixels 42 in the selected row. The horizontal driver 3 turns each switch 1 on and off multiple times within the horizontal scanning period. Thus, the video signal RAMP+ on the positive polarity and the video signal RAMP− on the negative polarity are alternately supplied to the pixels 42.

Specifically, the horizontal driver 3 includes a latch circuit 310, a counter 320, a comparator circuit 330, a shift register 360 and buffers 370. The latch circuit 310 corresponds to the latch circuit 10 in FIG. 1. That is, the latch circuit 310 has m columns of the latch circuits 10. The latch circuit 310 holds image data DATA of the pixels 42 in columns 1 to m.

The comparator circuit 330 corresponds to the comparator circuit 30 in FIG. 1. That is, the comparator circuit 330 has m columns of the comparator circuit 30. The output signal OUT from the comparator circuit 30 shown in FIG. 1 controls switch 1. The counter 320 corresponds to the counter 20 in FIG. 1. Therefore, the counter 320 performs a counting operation according to the counter clock signal CNT_CLOCK.

The shift register 360 sequentially transmits m columns of image data DATA according to the horizontal clock HCLOCK. When the shift register 360 holds m columns of the image data DATA, the shift register 360 outputs the image data DATA to the latch circuit 310. The latch circuit 310 stores the image data DATA of each column in response to the latch signal LATCH.

The comparator circuit 330 compares the latch output A with the counter output B, as shown in FIG. 1. The comparator circuit 330 controls a pair of switches 1a and 1b. The pair of switches 1a and 1b opens and closes in response to the output signal of the comparator circuit 330. Initially, the video signal is not supplied to the pixels 42 because all the pairs of the switches 1 are closed. When the output signal of the comparator circuit 330 is asserted, the switch 1 which corresponds to video signal is opened. Thus, the video signal RAMP+ on the positive polarity and a video signal RAMP− on the negative polarity are alternately applied to the pixels 42. The liquid crystal display device 200 can perform gradation display according to the image data DATA.

The buffers 370 buffer various signals output from an external controller. The buffers 370 are used to drive loads that are heavy due to the large number of rows in the pixel display part 50. For example, a horizontal clock signal HCLOCK is input to the shift register 360 via the buffer 370. Similarly, the latch signal LATCH is input to the latch circuit 310 via the buffer 370. The counter output from the counter 320 is input to the comparator circuit 330 via the buffer 370.

In this embodiment, the comparator circuit 330 includes the comparator circuit 30 shown in FIG. 1. Thus, a buffer for the comparator clock signal input into the comparator circuit 330 can be omitted. In other words, the number of buffers can be reduced in accordance with the number of columns, and thus it is possible to reduce power consumption. Furthermore, since timing errors can be suppressed, reliability can be improved.

As described above, the invention made by the inventor has been specifically explained based on the embodiment, but the invention is not limited to the above embodiment, and it goes without saying that various modifications can be made without departing from the gist of the invention.

What is claimed is:

1. A comparator circuit: comprising:
 a comparator element configured to output a matching signal indicating whether or not a value of a first input signal matches a value of a second input signal;
 a flip-flop circuit including a data input terminal to which a constant potential is supplied and a clock input terminal and configured to hold a value of the data input terminal based on a self-clock signal input to the clock input terminal; and
 a clock generation circuit configured to generate the self-clock signal based on the matching signal.

2. The comparator circuit according to claim 1, wherein an output of the flip-flop circuit is changed at a rising edge of the matching signal after a reset signal for resetting the output of the flip-flop circuit is input to the flip-flop circuit.

3. The comparator circuit according to claim 1, wherein the flip-flop circuit includes an inverting output terminal for outputting an inverted output signal, and wherein the output signal output from the flip-flop circuit is the inverted output signal.

4. The comparator circuit according to claim 3, wherein the clock generation circuit includes a NAND circuit; and
 wherein the matching signal output from the comparator element and the inverted output signal output from the flip-flop circuit are input to the NAND circuit,
 wherein the output signal output from the flip-flop circuit is the inverted output signal.

5. A driver of a liquid crystal display device comprising:
 a comparator circuit according to claim 1;
 a latch circuit configured to hold pixel data and output the pixel data to the comparator circuit as the first input signal; and
 a counter configured to perform a count operation in accordance with a counter clock signal and output a count value to the comparator element as the second input signal.

* * * * *